United States Patent
Ahn et al.

(10) Patent No.: US 7,485,507 B2
(45) Date of Patent: Feb. 3, 2009

(54) ORGANIC THIN-FILM TRANSISTOR, METHOD OF FABRICATING THE SAME, AND FLAT PANEL DISPLAY HAVING THE SAME

(75) Inventors: Taek Ahn, Suwon-si (KR); Jae-Bon Koo, Suwon-si (KR); Min-Chul Suh, Suwon-si (KR)

(73) Assignee: Samsung SDI Co., Ltd., Suwon (KR)

( * ) Notice: Subject to any disclaimer, the term of this patent is extended or adjusted under 35 U.S.C. 154(b) by 161 days.

(21) Appl. No.: 11/150,179

(22) Filed: Jun. 13, 2005

(65) Prior Publication Data
US 2006/0097254 A1    May 11, 2006

(30) Foreign Application Priority Data
Nov. 10, 2004    (KR) ............... 10-2004-0091522

(51) Int. Cl.
*H01L 21/00*    (2006.01)
*H01L 21/84*    (2006.01)
(52) U.S. Cl. .................. 438/153; 438/155; 257/59
(58) Field of Classification Search ............ 438/151, 438/149, 153–155, 99; 257/66, 59
See application file for complete search history.

(56) References Cited
U.S. PATENT DOCUMENTS

| | | | | |
|---|---|---|---|---|
| 5,329,140 | A * | 7/1994 | Sera ............................ | 257/66 |
| 5,981,317 | A * | 11/1999 | French et al. ............... | 438/161 |
| 6,335,539 | B1 * | 1/2002 | Dimitrakopoulos et al. ... | 257/40 |
| 6,894,736 | B2 * | 5/2005 | Battersby et al. ............. | 349/42 |
| 7,037,767 | B2 * | 5/2006 | Hirai ........................... | 438/149 |
| 2001/0008434 | A1 | 7/2001 | Battersby et al. | |
| 2004/0004220 | A1 * | 1/2004 | Suzuki ........................ | 257/66 |
| 2005/0009248 | A1 * | 1/2005 | Weng et al. ................. | 438/149 |
| 2005/0211975 | A1 * | 9/2005 | Kawasaki et al. ............ | 257/40 |

FOREIGN PATENT DOCUMENTS

| | | |
|---|---|---|
| CN | 1445596 | 10/2003 |
| JP | 2003-092410 | 3/2003 |
| JP | 2007-500452 | 1/2007 |
| KR | 10-2004-0028010 | 4/2004 |
| KR | 10-2004-0084427 | 10/2004 |

OTHER PUBLICATIONS

Chinese Office Action dated Jul. 04, 2008.

* cited by examiner

*Primary Examiner*—Theresa T Doan
(74) *Attorney, Agent, or Firm*—H.C. Park & Associates, PLC

(57) ABSTRACT

The present invention relates to an organic thin film transistor (OTFT), a method of fabricating the OTFT, and an organic electroluminescent display that has the OTFTs. The invention prevents surface damage of an organic semiconductor layer and reduces an off-current. The OTFT includes a substrate, a source electrode and a drain electrode formed on the substrate, and a semiconductor layer formed on the substrate that has a channel layer disposed over and between the source electrode and drain electrode. In addition, the OTFT includes a gate insulating layer formed on the semiconductor layer, a separation pattern formed through the semiconductor layer and the gate insulating layer to separate the channel layer, and a gate electrode formed on the gate insulating layer over the channel layer.

20 Claims, 8 Drawing Sheets

ORGANIC THIN-FILM TRANSISTOR, METHOD OF FABRICATING THE SAME, AND FLAT PANEL DISPLAY HAVING THE SAME

BACKGROUND OF THE INVENTION

This application claims the priority to and benefit of Korean Patent Application No. 10-2004-0091522, filed on Nov. 10, 2004, in the Korean Intellectual Property Office, the disclosure of which is incorporated herein in its entirety by reference.

1. Field of the Invention

The present invention relates to a thin-film transistor (TFT) for a flat panel display. More particularly, the present invention relates to an organic thin-film transistor (OTFT) for preventing damages on the surface of an organic semiconductor layer, a method of fabricating the same, and a flat panel display having the same.

2. Description of the Related Art

An organic thin-film transistor (OTFT) is a drive element for a next generation display that has been actively studied. The OTFT uses an organic material instead of silicon as a semiconductor layer. Depending on the compositional material of the organic layer, there are a low molecular weight OTFTs which are composed of oligothiophene, pentacene, and the like, and a high molecular weight OTFTs which are composed of polythiophenes, and the like.

An organic electroluminescent display device using such an OTFT as a switching element includes at least two OTFTs, for example, one switching OTFT, one drive OTFT, a capacitor, and an organic electroluminescent device which is composed of an organic layer interposed between upper and lower electrodes.

Generally, a flexible organic electroluminescent display device uses a flexible substrate that includes a plastic substrate. As the plastic substrate is very vulnerable to heat, the flexible organic electroluminescent display device must be fabricated using a low temperature process. Since the OTFT using an organic layer as a semiconductor layer can be made through low temperature processes, it is widely used as a switching element for the flexible organic electroluminescent display device.

Korean Patent Publication No. 2004-0028010 discloses a pentacene thin-film transistor for shortening a thin-film deposition time and improving hole mobility. Korean Patent Publication No. 2004-0084427 discloses a structure of an OTFT for improving electrical characteristics of a transistor and a method of forming the same. Further, Japanese Patent Publication No. 2003-92410 discloses a TFT that includes a channel region that is composed of an organic compound having radicals, improves carrier mobility, and an on/off current ratio.

Figure 1:
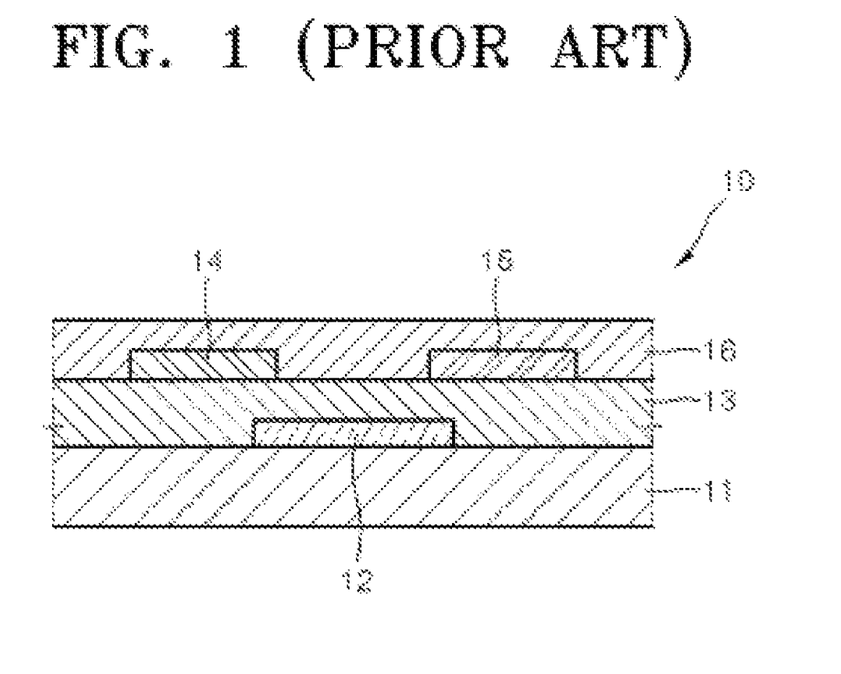
FIG. 1 is a sectional view that illustrates a conventional organic thin film transistor (OTFT).

FIG. 1 is a sectional view illustrating a conventional OTFT.

Referring to FIG. 1, the conventional OTFT includes a gate electrode 12 formed on a substrate 11, a gate insulating layer 13 formed on the substrate 11 having the gate electrode 12, source electrode 14 and drain electrode 15 formed on the gate insulating layer 13, and an organic semiconductor layer 16 formed on the source electrode 14, drain electrode 15, and the gate insulating layer 13.

The conventional OTFT structured as above includes an organic semiconductor layer as the semiconductor layer 16. The semiconductor layer 16 is formed on the overall surface of the substrate without patterns. However, as carriers, for example, holes may accumulate between the layers and the organic layer in the conventional OTFT structure, causing an undesired leakage current.

Figure 2:
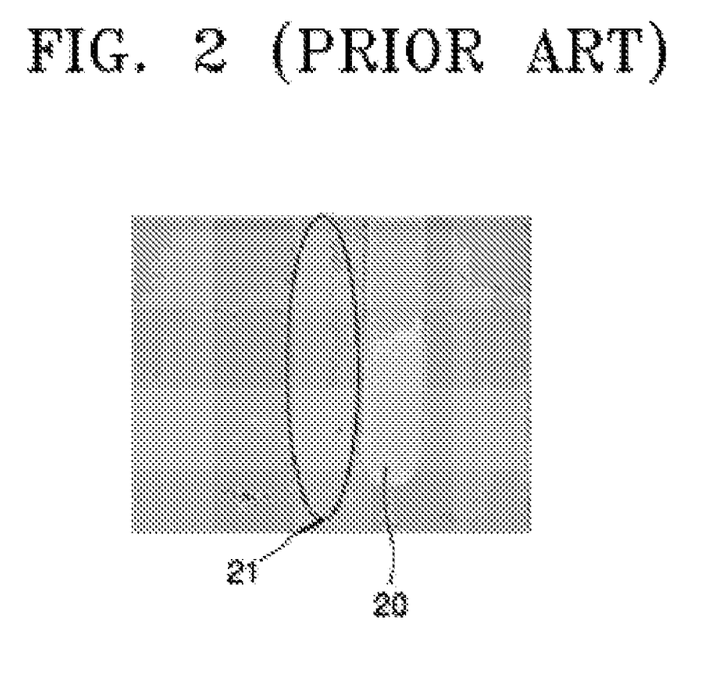
FIG. 2 illustrates that the surface of an organic semiconductor layer is damaged in the conventional OTFT when the organic semiconductor layer is patterned by a laser ablation method.

When patterning the semiconductor layer using laser ablation in order to reduce the accumulation of holes, thermal modification at an edge portion 21 of the patterned semiconductor layer 20, as shown in FIG. 2, or a recasting problem may occur.

SUMMARY OF THE INVENTION

The present invention provides an organic thin film transistor (OTFT), a method of fabricating the same, and an organic electroluminescent display having the same, in which an organic semiconductor layer can be patterned without causing surface damage to the organic semiconductor layer.

Additional features of the invention will be set forth in the description which follows, and in part will be apparent from the description, or may be learned by practice of the invention.

The present invention discloses a TFT that includes a substrate, a source electrode, and a drain electrode formed on the substrate. There is also a semiconductor layer formed on the substrate that has a channel layer disposed over and between the source electrode and the drain electrode. The TFT also includes a gate insulating layer formed on the semiconductor layer, a separation pattern formed through the semiconductor layer and the gate insulating layer to separate the channel layer and a gate electrode formed on the gate insulating layer over the channel layer.

The present invention also provides a flat panel display device including a substrate, a source electrode, and a drain electrode formed on the substrate. The device also has a semiconductor layer formed on the substrate with a channel layer disposed over and between the source electrode and the drain electrode and a gate insulating layer formed on the semiconductor layer. The device also has a separation pattern formed through the semiconductor layer and the gate insulating layer to separate the channel layer and a gate electrode formed on the gate insulating layer over the channel layer. In addition, it includes a protecting layer that has a via hole that exposes either the source electrode or the drain electrode, and a pixel electrode formed on the protecting layer that is connected to either the source electrode or the drain electrode through the via hole.

The present invention also provides a method of fabricating a TFT including forming a source electrode and a drain electrode on a substrate, forming a semiconductor layer with a channel layer on the source electrode and drain electrode and the substrate, and forming a gate insulating layer on the semiconductor layer. The method also involves patterning the gate insulating layer and the semiconductor layer, thereby forming a separation pattern for separating the channel layer and forming a gate electrode on the gate insulating layer over the channel layer.

It is to be understood that both the foregoing general description and the following detailed description are exemplary and explanatory and are intended to provide further explanation of the invention as claimed.

BRIEF DESCRIPTION OF THE DRAWINGS

The above and other features and advantages of the present invention will become more apparent by describing in detail exemplary embodiments thereof with reference to the attached drawings.

DETAILED DESCRIPTION OF THE INVENTION

The present invention will be described more fully hereinafter with reference to the accompanying drawings, in which preferred embodiments of the invention are shown. This invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the thicknesses of layers and regions are exaggerated for clarity. Like numbers refer to like elements throughout the specification.

Figure 3:
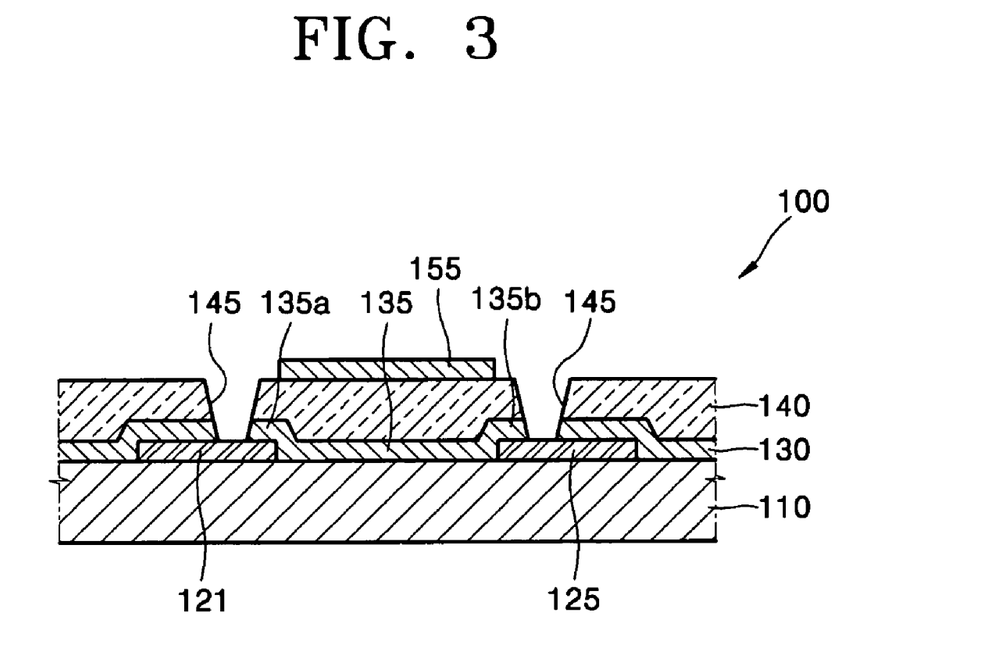
FIG. 3 is a sectional view that illustrates an OTFT according to an embodiment of the present invention.

FIG. 3 is a sectional view that illustrates an organic thin-film transistor (OTFT) used in a flexible organic electroluminescent display device according to an embodiment of the present invention.

Referring to FIG. 3, an OTFT 100 according to an embodiment of the present invention includes a source electrode 121 and a drain electrode 125 formed on a substrate 110. A semiconductor layer 130 and a gate insulating layer 140 are sequentially formed on the substrate 110. A gate electrode 155 is formed on the gate insulating layer 140 over a channel layer 135 of the semiconductor layer 130 between the source electrode 121 and drain electrode 125.

The substrate 110 may be made of a plastic and may include a plastic film selected from the group consisting of polyethersulphone (PES), polyacrylate (PAR), polyetherimide (PEI), polyethylene napthalate (PEN), polyethyeleneterephthalate (PET), polyphenylene sulfide (PPS), polyallylate, polyimide, polycarbonate (PC), cellulose triacetate (CTA), and cellulose acetate propionate (CAP).

The gate insulating layer 140 is formed of a single layer or multiple layers of an organic insulating layer or an inorganic insulating layer, or an organic/inorganic hybrid layer. The insulating layer 140 includes one or more inorganic insulating layers selected from the group consisting of $SiO_2$, $SiN_x$, $Al_2O_3$, $Ta_2O_5$, BST, and PZT.

Further, the insulating layer 140 includes at least one organic insulating layer selected from the group consisting of poly (methyl methacrylate) (PMMA), polystyrene (PS), phenol-based polymer, acryl-based polymer, imide-based polymer such as polyimide, arylether-based polymer, amide-based polymer, fluorine-based polymer, p-xylene-based polymer, vinylalcohol-based polymer and perylene.

The semiconductor layer 130 may have at least one organic layer that may include but is not limited to pentacene, retracement, anthracene, naphthalene, alpha-6-thiophene, perylene and its derivative, rubrene and its derivative, coronene and its derivative, perylene tetracarboxylic diimide and its derivative, perylene tetracarboxylic dianhydride and its derivative, polythiophene and its derivative polyparaperylenevinylene and its derivative, polyfluorene and its derivative, polythiophenevinylene and its derivative, polyparaphenylene and its derivative, polythiophene-heterocyclic aromatic copolymer and its derivative, oligoacene of a naphthalene and its derivative, oligothiophene of alpha-5-thiophene and its derivative, phthalocyanin optionally containing a metal and its derivative, pyromellitic dianhydride and its derivative, pyromellitic diimide and its derivative, perylene tetracarboxylic acid dianhydride and its derivative, naphthalene tetracarboxylic acid diimide and its derivative, naphthalene tetracarboxylic acid dianhydride and its derivative.

The OTFT 100 according to an embodiment of the present invention includes a separation pattern 145 that is formed through the semiconductor layer 130 and the gate insulating layer 140. The portion 135 of the semiconductor layer 130 that is disposed between the source electrode 121 and the drain electrode 125 and isolated by the separation pattern 145, functions as a channel layer of the TFT. The separation pattern 145 separates the channel layer 135 from a channel layer of a neighboring TFT and has a groove.

FIG. 5A, FIG. 5B, FIG. 5C, and FIG. 5D are plan views that illustrate various possible separation patterns 145 for separating the channel layer 135 in the OTFT for the organic electroluminescent display device according to an embodiment of the present invention. These figures show the TFT connected to a gate line 250 and a data line 220 to form a pixel of the organic electroluminescent display device. The embodiment of the present invention explains the use of the TFT of a pixel, which is illustrative and not restrictive. The present invention can be employed to all kinds of TFTs used in an organic electroluminescent display device.

Figure 5A:
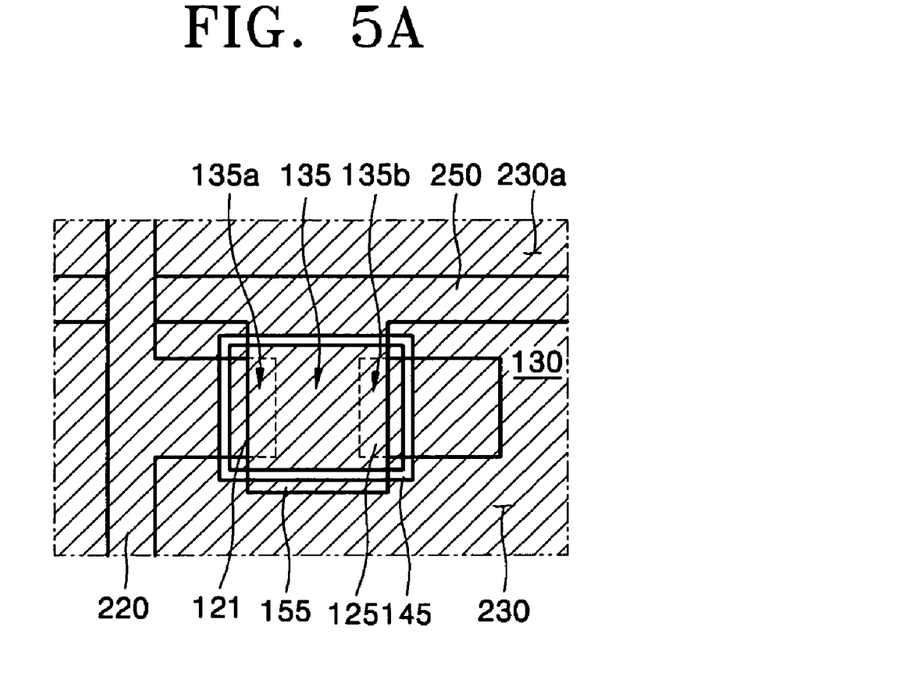
FIG. 5A, FIG. 5B, FIG. 5C, and FIG. 5D are plan views that illustrate various separation patterns of an organic semiconductor layer in an OTFT according to the present invention.

Referring to FIG. 5A, the separation pattern 145 has a closed loop shape surrounding the channel layer 135. The separation pattern 145 has a groove in a closed loop shape and is disposed in a pixel area 230 defined by a gate line 250 and a data line 220. The separation pattern 145 separates the channel region 135 from a TFT (not shown) disposed in a neighboring pixel area 230a.

In another example, the separation pattern 145 may be formed beyond the pixel area 230 to overlap the gate line 250 or the data line 220, or to extend over the neighboring pixel area 230a. In the drawing reference numbers 135a and 135b designate the portions where the semiconductor layer 130 overlaps the source electrode 121 and drain electrode 125.

Figure 5B:
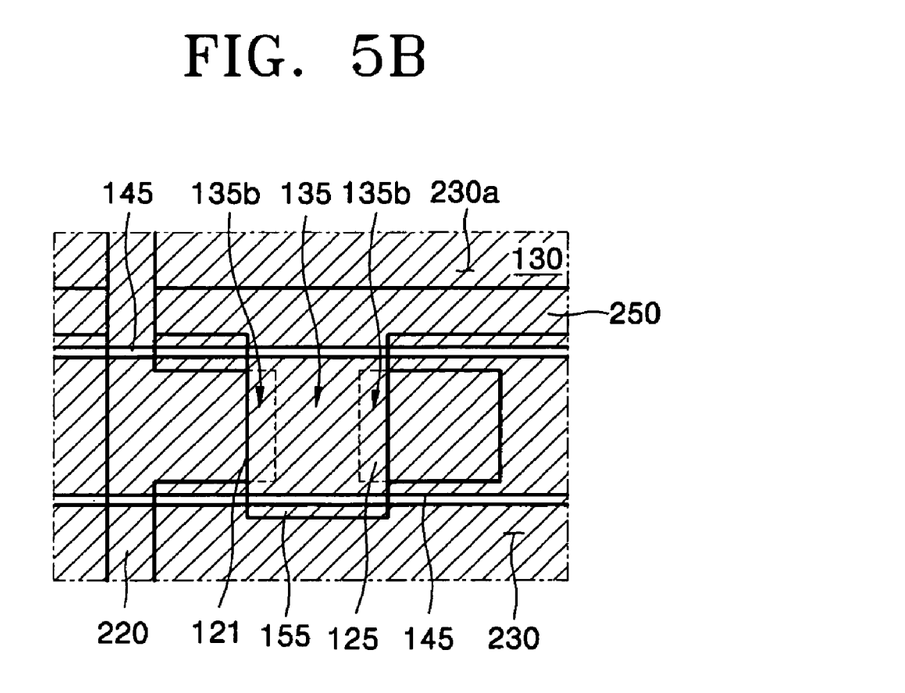

Referring to FIG. 5B, the separation pattern 145 is formed as a pair of parallel lines that extend along the gate line 250. The separation pattern 145 has groove corresponding to the pair of parallel lines. The channel layer 135 in the pixel area 230 is disposed between the grooves of the pair of parallel lines, and is separate from a TFT (not shown) disposed in a neighboring pixel area 230a.

In another example, the separation pattern 145 may be formed beyond the pixel area 230 to extend along the gate line 250 and extend over the neighboring pixel area 230a. The separation pattern 145 may separate the channel region 135 from a TFT (not shown) that is disposed in the neighboring pixel area 230a.

Figure 5C:
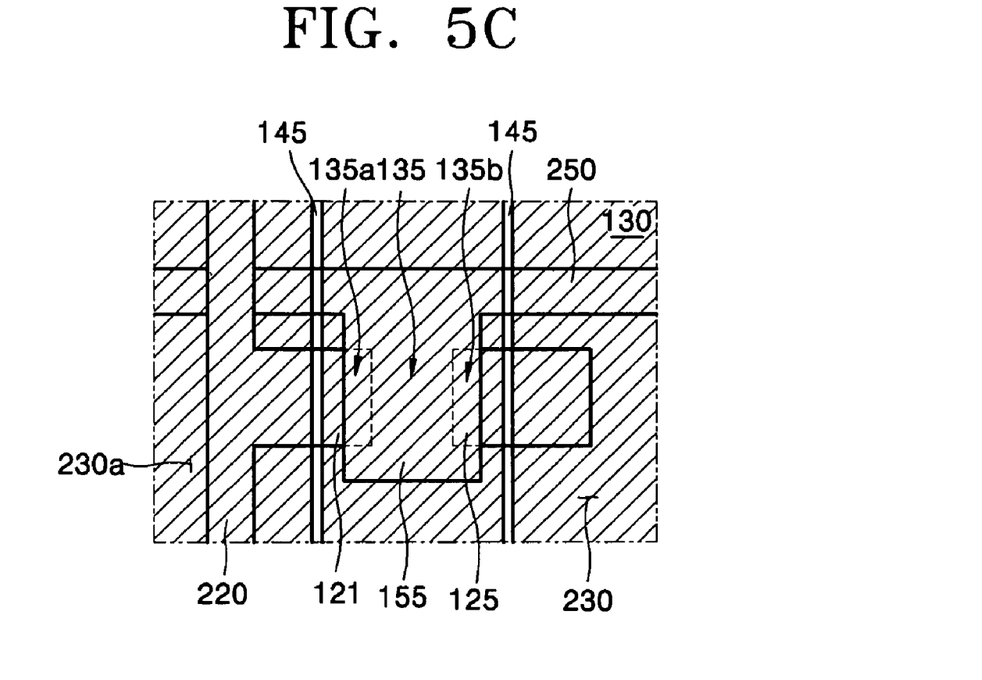

Referring to FIG. 5C, the separation pattern 145 is formed as a pair of parallel lines that extend along a data line 220. The separation pattern 145 has grooves corresponding to the pair of parallel lines. The channel layer 135 in the pixel area 230 is disposed between the grooves of the pair of parallel lines, and is separate from a TFT (not shown) disposed in a neighboring pixel area 230a.

In another example, the separation pattern 145 may be formed beyond the pixel area 230 in the grooves of the pair of parallel lines to extend along a data line 220 and extend over the neighboring pixel area 230a. The separation pattern 145 may separate the channel region 135 from a TFT (not shown) that is disposed in the neighboring pixel area 230a.

Figure 5D:
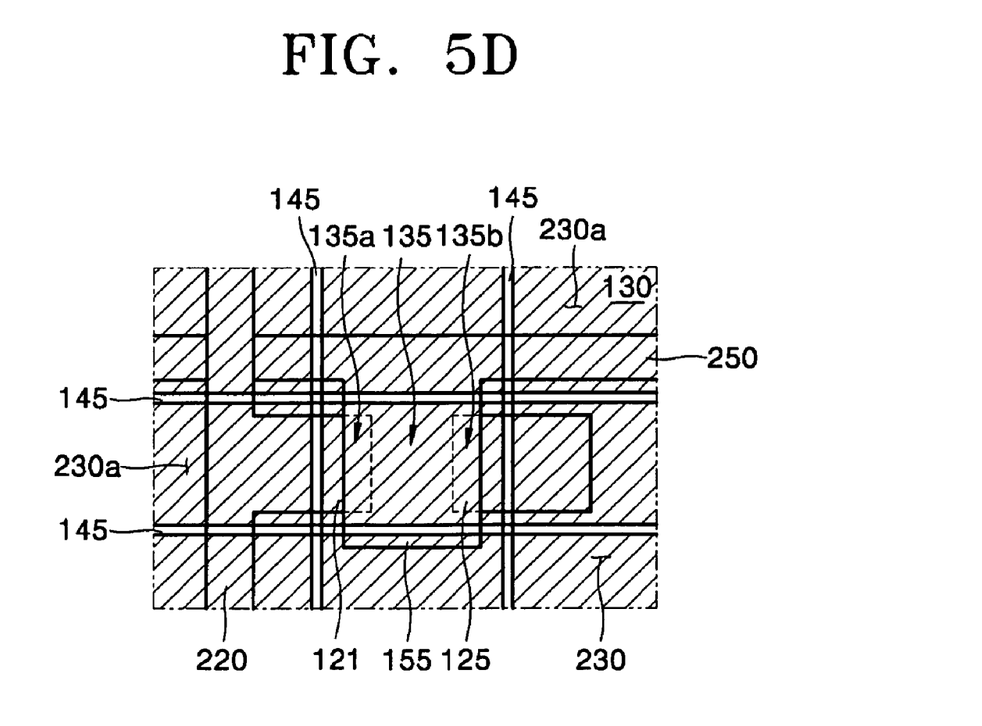

Referring to FIG. 5D, the separation pattern 145 is formed as two pairs of parallel lines that extend along a gate line 250 and a data line 220. The separation pattern 145 has grooves corresponding to the two pairs of parallel lines, and separates the channel layer 135 disposed between the grooves of the two pairs of parallel lines in the pixel area 230 from a TFT (not shown) disposed in a neighboring pixel area 230a.

In another example, the separation pattern 145 may be formed beyond the pixel area 230 in the grooves of the two pairs of parallel lines to extend along the gate line 250 and the data line 220 and extend over the neighboring pixel area 230a. The separation pattern 145 may separate the channel region 135 from a TFT disposed in the neighboring pixel area 230a.

In an embodiment of the present invention, the separation pattern 145 has grooves formed by etching the semiconductor layer 130 and the gate insulating layer 140 to partially expose the source electrode and drain electrode 121, 125. However, the separation pattern 145 is not restricted to this structure, and may have grooves formed by etching the semiconductor layer 130 down to a predetermined level in thickness.

The separation patterns 145 shown in FIG. 5A, FIG. 5B, FIG. 5C, and FIG. 5D are formed to separate the respective channel layers of the TFTs disposed in the neighboring pixel areas 230, 230a but it is not restricted to this. The separation pattern 145 may be applied to separate the channel layers of a plurality of TFTs disposed in one pixel area.

Figure 4:
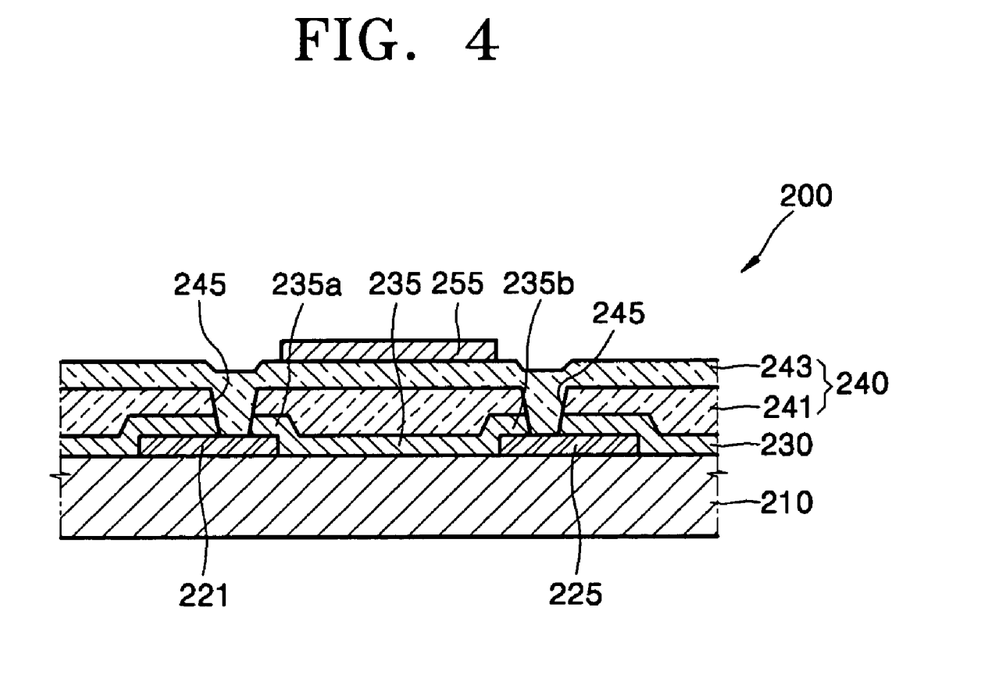
FIG. 4 is a sectional view that illustrates an OTFT according to another embodiment of the present invention.

FIG. 4 is a sectional view illustrating an OTFT used in a flexible organic electroluminescent display device according to another embodiment of the present invention.

Referring to FIG. 4, an OTFT 200 according to another embodiment of the present invention includes source electrode 221 and drain electrode 225 formed on a substrate 210, and a semiconductor layer 230 formed on the source electrode 221 and drain electrode 225. A gate insulating layer 240 is formed on the semiconductor layer 230. A gate electrode 255 is formed on the gate insulating layer 240 over a channel layer 235 disposed between the source electrode and drain electrode 221, 225.

The substrate 210 is a plastic substrate and may comprise a plastic film that includes, but is not limited to polyethersulphone (PES), polyacrylate (PAR), polyetherimide (PEI), polyethylene napthalate (PEN), polyethyeleneterepthalate (PET), polyphenylene sulfide (PPS), polyallylate, polyimide, polycarbonate (PC), cellulose triacetate (CTA), and cellulose acetate propionate (CAP).

The gate insulating layer 240 includes a first gate insulating layer 241 and a second gate insulating layer 243. The first gate insulating layer 241 and the second gate insulating layer 243 are formed of a single layer or multiple-layers of an organic insulating layer or an inorganic insulating layer, or an organic/inorganic hybrid layer. The first gate insulating layer 241 and the second gate insulating layer 243 may be composed of one same material or different materials, and may be formed with the same thickness or different thicknesses.

The first gate insulating layer 241 and the second gate insulating layer 243 may comprise one or more inorganic insulating layers including, but not limited to $SiO_2$, $SiN_x$, $Al_2O_3$, $Ta_2O_5$, BST, and PZT.

Further, the first insulating layer 241 and the second insulating layer 243 may comprise at least one organic insulating layer including, but not limited to poly(methyl methacrylate) (PMMA), polystyrene (PS), phenol-based polymer, acryl-based polymer, imide-based polymer such as polyimide, arylether-based polymer, amide-based polymer, fluorine-based polymer, p-xylene-based polymer, vinylalcohol-based polymer and parylene.

The semiconductor layer 230 may comprise at least one organic layer including, but not limited to pentacene, tetracene, anthracene, naphthalene, alpha-6-thiophene, perylene and its derivative, rubrene and its derivative, coronene and its derivative, perylene tetracarboxylic diimide and its derivative, perylene tetracarboxylic dianhydride and its derivative, polythiophene and its derivative, polyparaperylenevinylene and its derivative, polyfluorene and its derivative, polythiophenevinylene and its derivative, polyparaphenylene and its derivative, polythiophene-heterocyclic aromatic copolymer and its derivative, oligoacene of a naphthalene and its derivative, oligothiophene of alpha-5-thiophene and its derivative, phthalocyanin optionally containing a metal and its derivative, pyromellitic dianhydride and its derivative, pyromellitic diimide and its derivative, perylene tetracarboxylic acid dianhydride and its derivative, naphthalene tetracarboxylic acid diimide and its derivative, naphthalene tetracarboxylic acid dianhydride and its derivative.

The TFT in another embodiment of the present invention includes a separation pattern 245 formed through the semiconductor layer 230 and the first gate insulating layer 241 of the gate insulating layer 240. A portion 235 of the semiconductor layer 230, which is disposed between the source electrode 221 and drain electrode 225, functions as a channel layer of the TFT. The separation pattern 245 separates the channel layer 235 from a channel layer of a neighboring TFT, and may have various shapes as shown in FIGS. 5A through 5D.

Figure 6A:
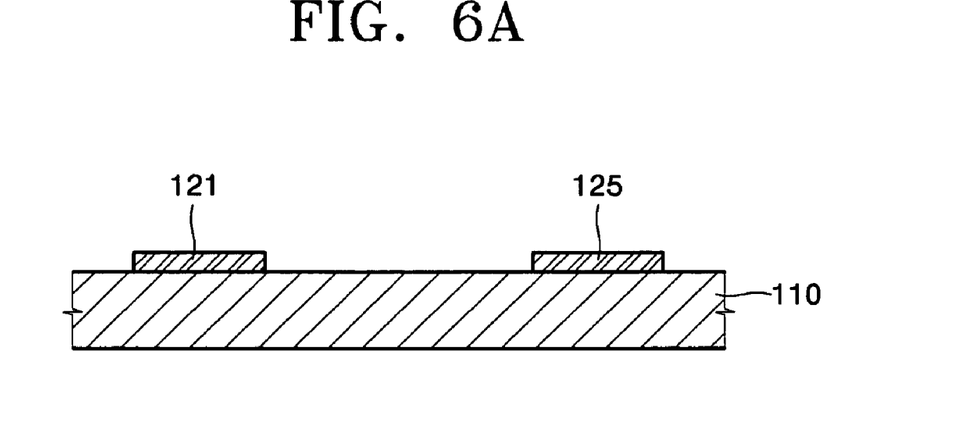
FIG. 6A, FIG. 6B, and FIG. 6C are sectional views that illustrate a method of forming an OTFT according to an embodiment of the present invention.
Figure 6B:
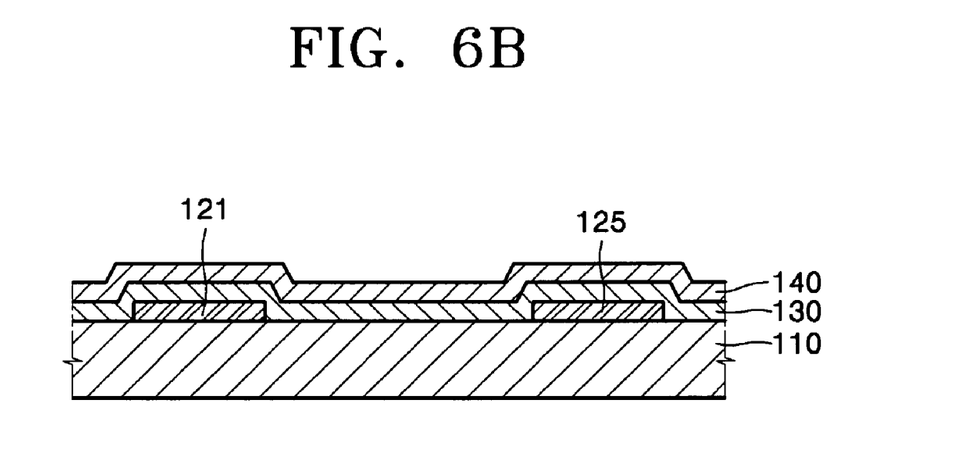
Figure 6C:
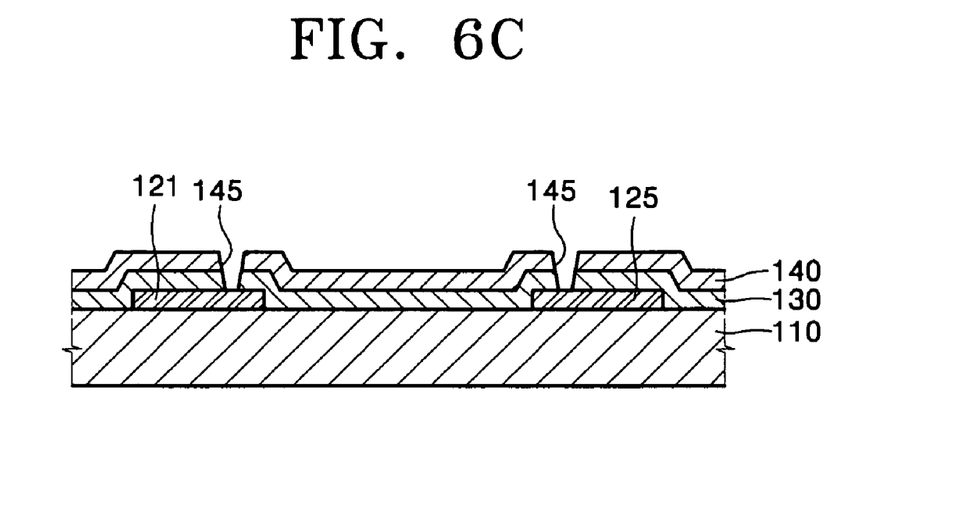

FIG. 6A, FIG. 6B, and FIG. 6C are sectional views that illustrate a method of forming an OTFT according to an embodiment of the present invention.

Referring to FIG. 6A, a source electrode 121 and a drain electrode 125 are formed on a plastic substrate 110. Referring to FIG. 6B, a semiconductor layer 130 is formed on the source electrode 121 and drain electrode 125 and the substrate 110. The semiconductor layer 130 includes an organic semiconductor layer. A gate insulating layer 140 is formed on the semiconductor layer 130.

Referring to FIG. 6C, the gate insulating layer 140 and the semiconductor layer 130 are patterned by laser ablation, thereby forming a separation pattern 145. The laser ablation method uses Excimer laser or YAG laser. Then, a gate electrode 155 is formed on the gate insulating layer 140 on the channel layer 135, thereby completing the formation of the OTFT according to an embodiment of the present invention as shown in FIG. 3.

The portion 135 separated from the semiconductor layer 130 by the separation pattern 145 functions as a channel layer of the TFT. The separation pattern 145 has grooves as shown in FIG. 5A, FIG. 5B, FIG. 5C, and FIG. 5D. The separation pattern 145 functions to separate the channel layer 135 from a neighboring TFT.

According to an embodiment of the present invention, as the semiconductor layer 130 is patterned by laser ablation after the gate insulating layer 140 is formed on the semiconductor layer 130, the surface damage of the organic semiconductor layer can be minimized and an off-current of the transistor can be reduced by preventing accumulation of carriers.

FIG. 7A, FIG. 7B, FIG. 7C, and FIG. 7D are sectional views that illustrate a method of forming an OTFT according to another embodiment of the present invention.

Figure 7A:
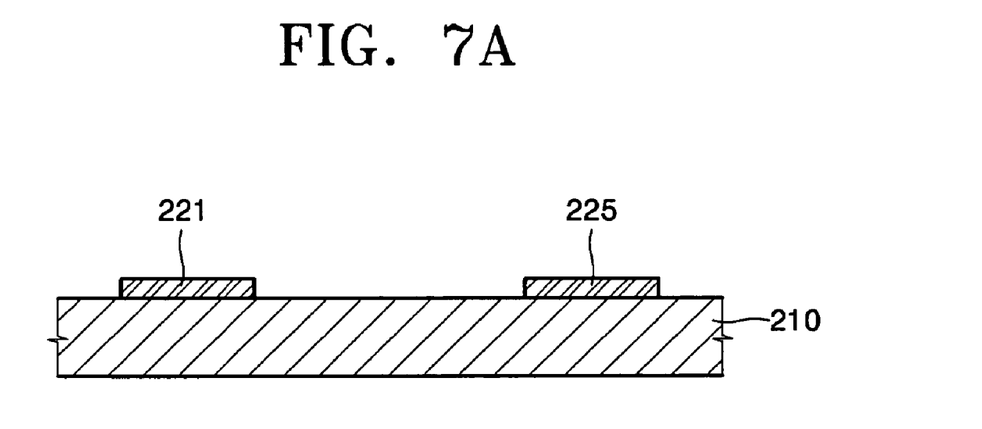
FIG. 7A, FIG. 7B, FIG. 7C, and FIG. 7D are sectional views that illustrate a method of forming an OTFT according to another embodiment of the present invention.
Figure 7B:
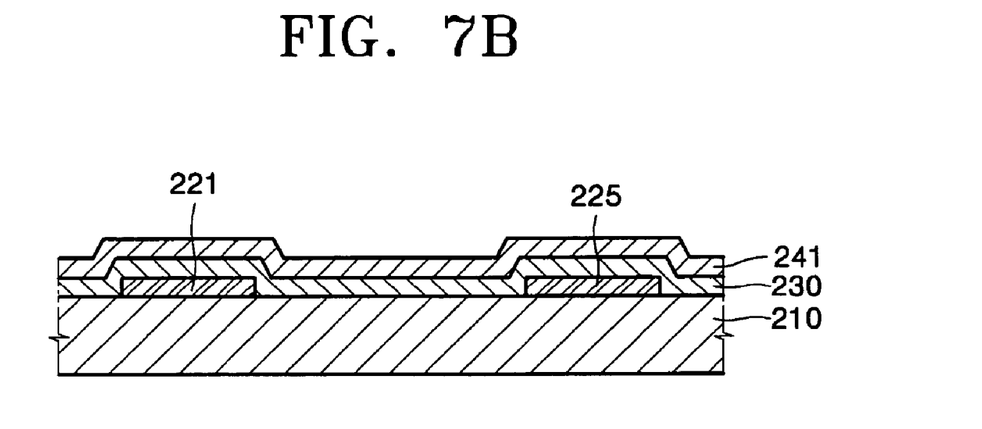

Referring to FIG. 7A, source electrode 221 and drain electrode 225 are formed on a plastic substrate 210. Referring to FIG. 7B, a semiconductor layer 230 is formed on the source electrode 221 and drain electrode 225 and the substrate 210. The semiconductor layer 230 includes an organic semiconductor layer. A first gate insulating layer 241 is formed on the semiconductor layer 230.

Figure 7C:
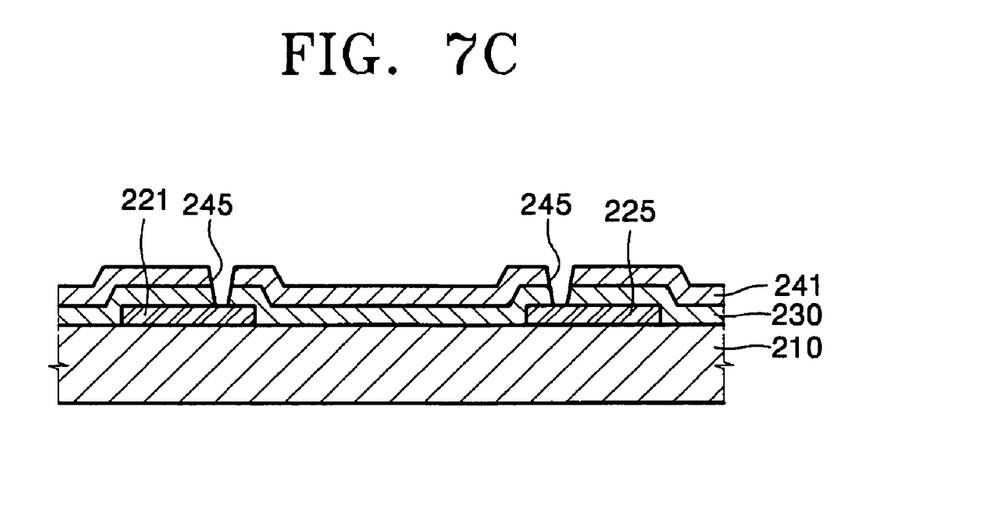

Referring to FIG. 7C, the first gate insulating layer 241 and the semiconductor layer 230 are patterned by laser ablation, thereby forming a separation pattern 245. The laser ablation method uses an Excimer laser or a YAG laser.

The portion 235 separated from the semiconductor layer 230 by the separation pattern 245 functions as a channel layer of the TFT. The separation pattern 245 has grooves as shown in FIG. 5A, FIG. 5B, FIG. 5C, and FIG. 5D. The separation pattern 245 functions to separate the channel layer 235 from a neighboring TFT.

Figure 7D:
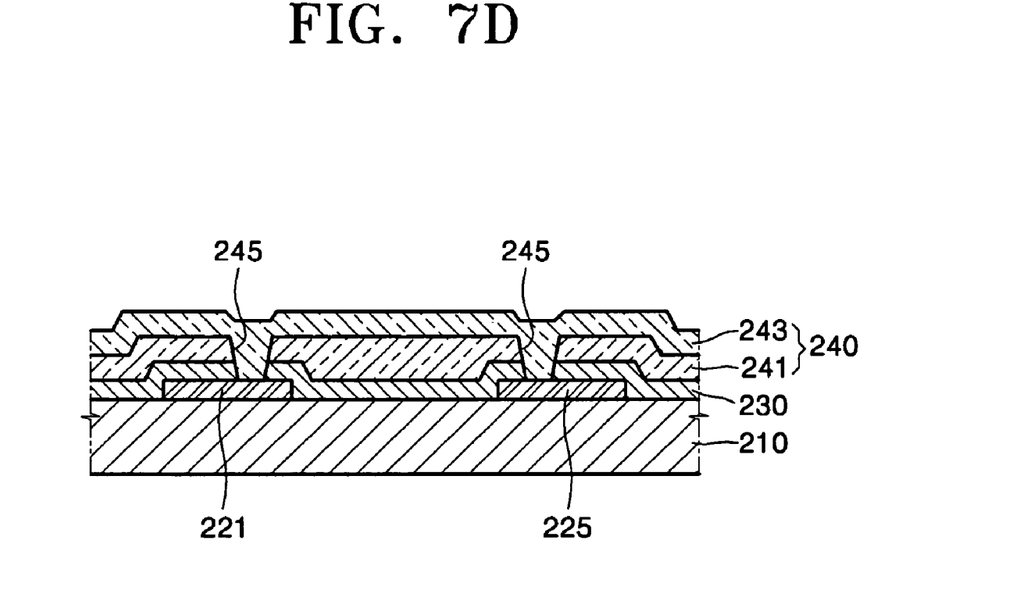

Referring to FIG. 7D, a second gate insulating layer 243 is formed on the first gate insulating layer 241 and the separation pattern 245. Thus, a gate insulating layer 240 including the first gate insulating layer 241 and the second gate insulating layer 243 is formed. Then, a gate electrode 255 is formed on the second gate insulating layer 243 on the channel layer 235, thereby forming the OTFT according to another embodiment of the present invention as shown in FIG. 4.

The thicknesses of the first gate insulating layer 241 and the second gate insulating layer 243 are in accordance with the thickness of the gate insulating layer 240 required in the OTFT according to another embodiment of the present invention. The first gate insulating layer 241 and the second gate insulating layer 243 may be composed of the same material or different materials. The first gate insulating layer 241 and the second gate insulating layer 243 may be formed with the same thickness or different thicknesses.

In another embodiment of the present invention, as the semiconductor layer 230 is patterned using a laser ablation method after the first gate insulating layer 241 is formed on the semiconductor layer 230, the surface damage of the organic semiconductor layer can be minimized and an off-current of the transistor can be reduced by preventing accumulation of carriers.

Further, when the gate insulating layer 240 is formed of an organic insulating material, as the gate insulating layer 240 is composed of stacked layers including the first gate insulating layer 241 and the second gate insulating layer 243, even though pin holes are generated in the first gate insulating layer 241 of the organic insulating layer, the first gate insulating layer 241 is coated with the second gate insulating layer 243 of the organic insulating layer thereon, thereby preventing failures due to the pin holes.

Further, when a taper angle of the separation pattern 245 during the formation of the separation pattern 245 by etching the first gate insulating layer 241 and the semiconductor layer 230 is large, processing failures may occur in subsequent processes. The taper angle can be reduced by coating the second gate insulating layer 243 on the first gate insulating layer 231, thereby preventing the processing failures.

In the OTFTs according to the embodiments of the present invention, the semiconductor layer includes a high molecular weight organic semiconductor layer and a low molecular weight organic semiconductor layer. The gate insulating layer includes a high molecular weight organic insulating layer and a low molecular weight organic insulating layer or an inorganic insulating layer. The semiconductor layer and the gate insulating layer are formed by a deposition or coating method.

Figure 8:
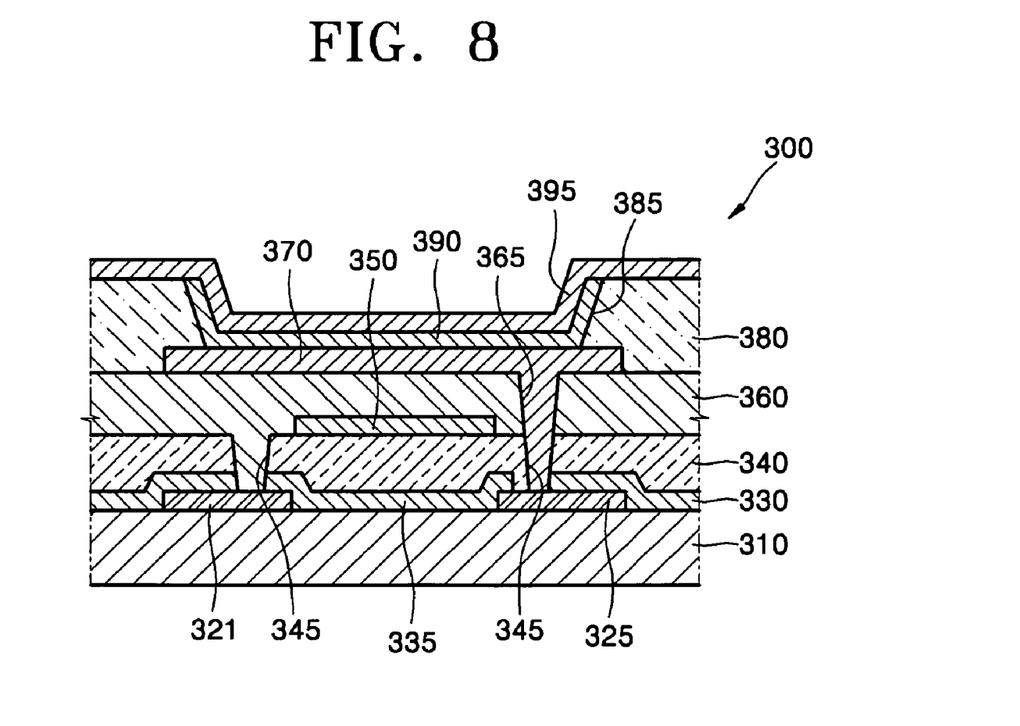
FIG. 8 is a sectional view that illustrates an organic electroluminescent display is device that has an OTFT according to an embodiment of the present invention.

FIG. 8 is a sectional view that illustrates an organic electroluminescent display device with the OTFT according to an embodiment of the present invention. Specifically, FIG. 8 illustrates one pixel of an organic electroluminescent display device, and particularly shows an organic electroluminescent device and a drive TFT for driving the device in one pixel.

Referring to FIG. 8, an organic electroluminescent display device 300 according to an embodiment of the present invention includes source electrode 321 and drain electrode 325 formed on a plastic substrate 310. A semiconductor layer 330 is formed on the source electrode 321 and drain electrode 325 and the substrate 310. A gate insulating layer 340 is formed on the semiconductor layer 330.

A separation pattern 345 is formed on the gate insulating layer 340 and the semiconductor layer 330 to separate a channel layer 335 from a neighboring TFT. The separation pattern 345 has a groove as shown in FIG. 5A, FIG. 5B, FIG. 5C, and FIG. 5D.

A gate electrode 350 is formed on the gate insulating layer 340 over the channel layer 335, and a protecting layer 360 is formed on the gate insulating layer 340 and the separation pattern 345. The gate insulating layer 340 and the protecting layer 360 also have a via hole 365 exposing either the source electrode 321 or the drain electrode 325. For example, the via hole 365 exposes a portion of the drain electrode 325.

A lower electrode 370 is formed on the protecting layer 360 to be connected with the drain electrode 325 of the TFT through the via hole 365. The lower electrode 370 functions as a pixel electrode as well as an anode electrode. A pixel isolation layer 380 is formed with an opening 385 exposing a portion of the lower electrode 370.

An organic layer 390 is formed on the lower electrode 370 and is exposed by the opening 385. An upper electrode 395 as a cathode electrode is formed over the substrate. The organic layer 390 includes one or more organic layers such as a hole injecting layer, a hole transporting layer, a light emitting layer, an electron injecting layer, an electron transporting layer, and a hole blocking layer.

Figure 9:
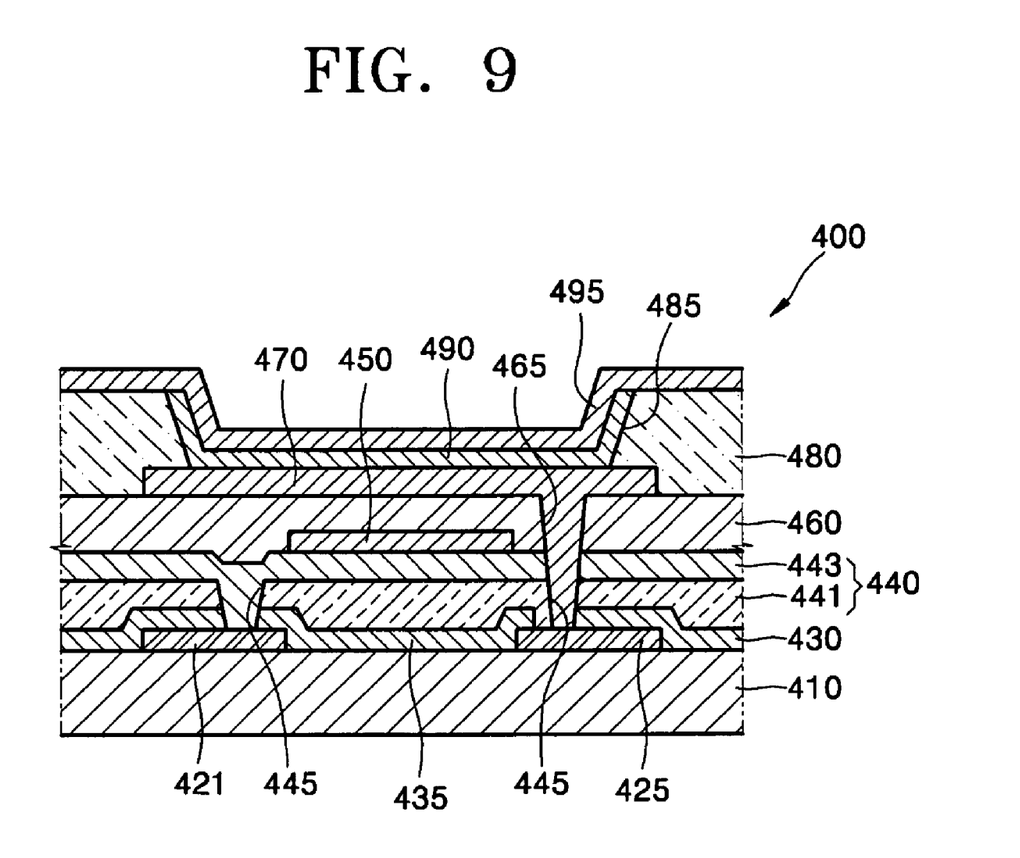
FIG. 9 is a sectional view that illustrates an organic electroluminescent display device that has an OTFT according to another embodiment of the present invention.

FIG. 9 is a sectional view that illustrates an organic electroluminescent display device that has an OTFT according to another embodiment of the present invention. The structure of the organic electroluminescent display device shown by FIG. 9 is the same as that of the organic electroluminescent display device according to another embodiment of the present invention, except that a gate insulating layer 440 is composed of two insulating layers including a first gate insulating layer 441 and a second gate insulating layer 441, and a separation pattern 445 is formed through a semiconductor layer 430 and the first gate insulating layer 431.

Referring to FIG. 9, an organic electroluminescent display device 400 includes source electrode 421 and drain electrode 425 formed on a plastic substrate 410. A semiconductor layer 430 is formed on the source electrode 421 and drain electrode 425 and the substrate 410. A gate insulating layer 440 is formed on the semiconductor layer 430. The gate insulating layer 440 includes the first gate insulating layer 441 and the second gate insulating layer 443.

A separation pattern 445 is formed on the first gate insulating layer 441 of the gate insulating layer 440 and the semiconductor layer 430 to separate a channel layer 435 from a neighboring TFT. The separation pattern 445 has a groove as shown in FIG. 5A, FIG. 5B, FIG. 5C, and FIG. 5D.

A gate electrode 450 is formed on the gate insulating layer 440 over the channel layer 435, and a protecting layer 460 is formed over the substrate. The gate insulating layer 440 and the protecting layer 460 have a via hole 465 exposing either the source electrode 421, or the drain electrode 425. For example, the via hole 465 exposes a portion of the drain electrode 425.

A lower electrode 470 is formed on the protecting layer 460 and is connected to the drain electrode 425 of the TFT through the via hole 465. The lower electrode 470 functions as a pixel electrode as well as an anode electrode. A pixel isolation layer 480 is formed with an opening 485 exposing a portion of the lower electrode 470.

An organic layer 490 is formed on the lower electrode 470 exposed by the opening 485 of the pixel isolation layer 480, and an upper electrode 495 as a cathode electrode is formed over the substrate. The organic layer 490 has one or more organic layers including, for example, a hole injecting layer, a hole transporting layer, a light emitting layer, an electron injecting layer, an electron transporting layer, and a hole blocking layer.

The embodiments of the present invention have described an organic electroluminescent display device with an OTFT as a switching element. The present invention can be also applied to a flat panel display device such as a liquid crystal display device using the OTFT as a switching element, thereby providing the benefits of reducing the off-current of a TFT and preventing the surface damage of an organic semiconductor layer.

While the protecting layer has been described as having a single layer in the various embodiments of the present invention, this is just illustrative and not restrictive. Thus, the protecting layer may be formed of multiple layers. Further, they may be comprised of an organic insulating layer, an inorganic insulating layer, or hybrid stacked layers including an organic insulating layer and an inorganic insulating layer.

Further, the embodiments of the present invention have described forming a separation pattern on a semiconductor layer using a laser ablation in a flexible organic electroluminescent display device having a plastic substrate. These embodiments are illustrative and are not restrictive. In addition, the present invention can be applied to forming integration lines or an OTFT on a metal glass substrate.

The OTFT and the method of fabrication according to various embodiments of the present invention provide several benefits. For example, the formation of a separation pattern in a groove shape by patterning a semiconductor layer and a gate insulating layer formed on the semiconductor layer using laser ablation prevents surface damage of the semiconductor layer. In addition, a leakage current due to the accumulation of carriers is prevented so as to reduce an off-current of the TFT.

Further, as the gate insulating layer is a stack-layered structure and the separation pattern is formed on just a portion of the gate insulating layer to separate the semiconductor layer, the pin hole failures generated in the gate insulating layer, which is composed of an organic insulating layer, can be prevented.

Further, as a complicated photolithography process is not necessary, and all of the semiconductor layer but a channel layer is not necessary to remove, the fabrication processes are simplified and process time can be shortened.

The embodiments of the present invention have described the organic electroluminescent display device having the OTFT as a switching element. The present invention can be also applied to a flat panel display device such as a liquid crystal display device using the OTFT as a switching element, thereby providing effects of reducing the off-current of a TFT and preventing the surface damage of an organic semiconductor layer.

In the embodiments of the present invention, the protecting layer is formed of a single layer, which is just illustrative and not restrictive and so, they may be formed of multi-layers. Further, they may be composed of an organic insulating layer or an inorganic insulating layer, or hybrid stacked layers including an organic insulating layer and an inorganic insulating layer.

Further, the embodiments of the present invention have described on forming a separation pattern on a semiconductor layer using a laser ablation method in a flexible organic electroluminescent display device having a plastic substrate, which is illustrative and not restrictive. In addition to that, the present invention can be applied to the case of forming integration lines or an OTFT on a substrate such as a metal substrate or glass substrate.

While the present invention has been particularly shown and described with reference to exemplary embodiments thereof, it will be understood by those of ordinary skill in the art that various changes in form and details may be made therein without departing from the spirit and scope of the present invention as defined by the following claims. Thus, it is intended that the present invention cover the modifications and variations of this invention provided they fall within the scope of the appended claims and their equivalents.

What is claimed is:

1. A method of fabricating a TFT, comprising:
    forming a source electrode and a drain electrode on a substrate;
    forming a semiconductor layer disposed on the source electrode and the drain electrode and the substrate and having a channel layer;
    forming a gate insulating layer on the semiconductor layer;
    patterning the gate insulating layer and the semiconductor layer, thereby forming a separation pattern; and
    forming a gate electrode on the gate insulating layer over the channel layer,
    wherein the separation pattern is surrounded by the gate insulating layer and the semiconductor layer.

2. The method of claim 1, wherein the substrate includes a plastic substrate.

3. The method of claim 1, wherein the semiconductor layer includes an organic semiconductor layer.

4. The method of claim 1, wherein the separation pattern has a groove shape.

5. The method of claim 4, wherein the separation pattern has a closed loop shape.

6. The method of claim 4, wherein the separation pattern has a shape of at least one pair of parallel lines.

7. The method of claim 1, wherein the gate insulating layer includes a first gate insulating layer and a second gate insulating layer; and
    wherein the separation pattern is formed through the semiconductor layer and the first gate insulating layer.

8. The method of claim 1, wherein the separation pattern is formed using a laser ablation method.

9. The method of claim 1, wherein the source electrode and the drain electrode are disposed in a pixel area, and the gate insulating layer and the semiconductor layer are arranged on both sides of the separation pattern in the pixel area.

10. A method of fabricating a TFT, comprising:
forming a source electrode and a drain electrode on a substrate;
forming an organic semiconductor layer disposed on the source electrode and the drain electrode and the substrate and having a channel layer;
forming a first gate insulating layer on the organic semiconductor layer;
patterning the first gate insulating layer and the organic semiconductor layer after forming the first gate insulating layer on the organic semiconductor layer, thereby forming a separation pattern; and
forming a gate electrode on the first gate insulating layer over the channel layer,
wherein the separation pattern is surrounded by the gate insulating layer and the semiconductor layer.

11. The method of claim 10, wherein the substrate includes a plastic substrate.

12. The method of claim 10, wherein the first gate insulating layer is an organic layer.

13. The method of claim 10, wherein the separation pattern has a groove shape.

14. The method of claim 13, wherein the separation pattern has a closed loop shape.

15. The method of claim 13, wherein the separation pattern has a shape of at least one pair of parallel lines.

16. The method of claim 10, wherein the separation pattern is formed using a laser ablation method.

17. The method of claim 10, further comprising:
forming a second gate insulating layer on the first gate insulating layer after patterning the first gate insulating layer and the organic semiconductor layer,
wherein the gate electrode is formed directly on the second gate insulating layer.

18. The method of claim 17, wherein the second gate insulating layer contacts the organic semiconductor layer via the separation pattern.

19. The method of claim 17, wherein the first gate insulating layer and the second gate insulating layer are both organic layers.

20. The method of claim 10, wherein the source electrode and the drain electrode are disposed in a pixel area, and the gate insulating layer and the semiconductor layer are arranged on both sides of the separation pattern in the pixel area.

* * * * *